US012628409B2

(12) United States Patent
Gandikota et al.

(10) Patent No.: US 12,628,409 B2
(45) Date of Patent: May 12, 2026

(54) MULTI-THRESHOLD VOLTAGE INTEGRATION SCHEME FOR SEMICONDUCTOR DEVICES

(71) Applicant: Applied Materials, Inc., Santa Clara, CA (US)

(72) Inventors: Srinivas Gandikota, Santa Clara, CA (US); Tengzhou Ma, San Jose, CA (US); Geetika Bajaj, Cupertino, CA (US); Debaditya Chatterjee, Sunnyvale, CA (US); Hsin-Jung Yu, Santa Clara, CA (US); Pei Hsuan Lin, Millbrae, CA (US); Yixiong Yang, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 406 days.

(21) Appl. No.: 18/140,850

(22) Filed: Apr. 28, 2023

(65) Prior Publication Data

US 2024/0363723 A1 Oct. 31, 2024

(51) Int. Cl.
  *H10D 64/68* (2025.01)
  *H10D 64/01* (2025.01)
  (Continued)

(52) U.S. Cl.
  CPC ........... *H10D 64/685* (2025.01); *H10D 64/01* (2025.01); *H10D 64/691* (2025.01);
  (Continued)

(58) Field of Classification Search
  CPC .......... H01L 21/02107; H01L 21/0228; H01L 21/30; H01L 21/31; H01L 21/31645;
  (Continued)

(56) References Cited

U.S. PATENT DOCUMENTS 8,420,474 B1 4/2013 Frank et al.
8,786,032 B2 7/2014 Xu et al.
(Continued)

FOREIGN PATENT DOCUMENTS

KR 20140086609 A 7/2014
WO 9945594 A1 9/1999

OTHER PUBLICATIONS

PCT International Search Report and Written Opinion in PCT/US2024/026189 dated Aug. 20, 2024, 10 pages.
(Continued)

*Primary Examiner* — Wael M Fahmy
*Assistant Examiner* — Shamita S Hanumasagar
(74) *Attorney, Agent, or Firm* — SERVILLA WHITNEY LLC

(57) ABSTRACT

Methods of manufacturing electronic devices are described. Embodiments of the present disclosure advantageously provide methods of manufacturing electronic devices that meet reduced thickness, reduced leakage, lower thermal budget, and $V_t$ requirements (including multi-$V_t$), and have improved device performance and reliability. The method comprises forming a P-dipole stack and an N-dipole stack on a semiconductor substrate by: depositing an interfacial layer (e.g., silicon oxide (SiOx)) on the top surface of the channel; depositing a hafnium-containing layer comprising hafnium oxide (HfOx) and having a thickness of less than or equal to 5 Å on the interfacial layer; and depositing a dipole layer comprising lanthanum nitride (LaN) on the hafnium-containing layer.

18 Claims, 5 Drawing Sheets

(51) Int. Cl.
   *H10D 84/01* (2026.01)
   *H10D 84/03* (2025.01)
   *H10D 84/85* (2025.01)

(52) U.S. Cl.
   CPC ..... *H10D 84/0179* (2025.01); *H10D 84/0181* (2025.01); *H10D 84/038* (2025.01); *H10D 84/85* (2025.01)

(58) Field of Classification Search
   CPC .... H01L 21/324; H10D 64/01; H10D 64/118; H10D 64/60; H10D 64/685
   See application file for complete search history.

(56) References Cited

U.S. PATENT DOCUMENTS

| | | | |
|---|---|---|---|
| 11,088,258 B2 | 8/2021 | Wang et al. | |
| 11,205,650 B2 * | 12/2021 | Huang | H10D 64/667 |
| 11,289,579 B2 | 3/2022 | Lin et al. | |
| 2007/0158702 A1 | 7/2007 | Doczy et al. | |
| 2011/0147798 A1 | 6/2011 | Radosavljevic et al. | |
| 2012/0184093 A1 | 7/2012 | Chudzik et al. | |
| 2015/0262887 A1 | 9/2015 | Xu et al. | |
| 2017/0179252 A1 * | 6/2017 | Tang | H10D 64/667 |
| 2019/0088798 A1 | 3/2019 | Kim et al. | |
| 2019/0148237 A1 | 5/2019 | Wang | |
| 2019/0279913 A1 | 9/2019 | Gluschenkov et al. | |
| 2020/0119164 A1 | 4/2020 | Tsau et al. | |
| 2020/0373331 A1 | 11/2020 | Kim et al. | |
| 2020/0373404 A1 * | 11/2020 | Lin | H10D 64/685 |
| 2021/0005664 A1 | 1/2021 | Fratin et al. | |
| 2021/0028285 A1 | 1/2021 | Chang et al. | |
| 2021/0098581 A1 | 4/2021 | Lin et al. | |
| 2021/0376109 A1 | 12/2021 | Wang et al. | |
| 2021/0391439 A1 * | 12/2021 | Pao | H10D 84/834 |
| 2021/0408282 A1 * | 12/2021 | Tiwari | H10D 64/01 |
| 2022/0108984 A1 | 4/2022 | Huang et al. | |

OTHER PUBLICATIONS

"PCT International Search Report and Written Opinion in PCT/US2020/033623 dated Oct. 20, 2020, 12 pages".
"PCT International Search Report and Written Opinion in PCT/US2020/053182 dated Jan. 15, 2021, 12 pages".
"U.S. Appl. No. 17/673,905, filed Feb. 17, 2022, 49 pages".
"U.S. Appl. No. 18/124,674, filed Mar. 22, 2023, 56 pages".
"U.S. Appl. No. 18/126,583, filed Mar. 27, 2023, 53 pages".
Jeon, Nari, et al., "Plasma-Enhanced Atomic Layer Deposition of TiAlN: Compositional and Optoelectronic Tunability", ACS Appl. Mater, Interfaces 2019, 11, 11602-11611.
Linn, Yu-Hsian, et al., "Work Function Adjustment by Using Dipole Engineering for TaN-Al2O3-Si3N4-HfSiOx-Silicon Nonvolatile Memory", Materials 2015, 8, 5112-5120; doi:10.3390/ma8085112, Aug. 7, 2015.

* cited by examiner

100

200

200

MULTI-THRESHOLD VOLTAGE INTEGRATION SCHEME FOR SEMICONDUCTOR DEVICES

TECHNICAL FIELD

Embodiments of the present disclosure pertain to the field of electronic device manufacturing, and in particular, to transistors. More particularly, embodiments of the disclosure are directed to FinFET and GAA devices and methods of manufacturing FinFET and GAA devices.

BACKGROUND

Integrated circuits have evolved into complex devices that can include millions of transistors, capacitors, and resistors on a single chip. In the course of integrated circuit evolution, functional density (i.e., the number of interconnected devices per chip area) has generally increased while geometry size (i.e., the smallest component (or line) that can be created using a fabrication process) has decreased.

Transistors are circuit components or elements that are often formed on semiconductor devices. Many transistors may be formed on a semiconductor device in addition to capacitors, inductors, resistors, diodes, conductive lines, or other elements, depending on the circuit design. Integrated circuits incorporate planar field-effect transistors (FETs) in which current flows through a semiconducting channel between a source and a drain, in response to a voltage applied to a control gate.

As device dimensions have shrunk, device geometries and materials have experienced difficulty maintaining switching speeds without incurring failures. Several new technologies emerged that allowed chip designers to continue shrinking gate lengths. Control of the dimensions of device structure is a key challenge for present and future technology generations.

Shrinking of the materials currently used as negative metal-oxide-semiconductor (N-MOS) transistors and positive metal-oxide-semiconductor (P-MOS) transistors have become a challenge due to change in basic properties, such as threshold voltage ($V_t$). Additionally, the migration of transistor technology from planar FET to FinFET to GAA devices requires conformal work-function layers for multiple threshold voltages (multi-$V_t$). The $V_t$ tuning range will be limited by the film thickness variation with further scaling down of device sizes.

There are also challenges associated with conventional dipole engineering techniques. To achieve the desired dipole effect, the desired element is driven from a deposited film with spike anneal and removed after drive in. The spike anneal can potentially cause an equivalent oxide thickness (EOT) penalty and high thermal budget because free oxygen atoms in the gate dielectric layers and the overlaying dipole stack diffuse downward to oxidize the underlying silicon layer.

Additionally, precise control of the amount of dipole species in metal gate stacks, such as high-K metal gate stacks, is crucial to achieve desired $V_t$ (or multi-$V_t$) for transistors. Conventional processes include "dipole first" processes and "dipole last" processes. Typically, dipole first processes include flowing a metal-containing precursor and a reactant over an interfacial layer to deposit metal atoms on the interfacial layer (forming a treated interfacial layer) to achieve desired dipole effect, followed by depositing a high-K dielectric layer on the treated interfacial layer. Dipole last processes typically include forming an interfacial layer on a substrate, forming a high-K dielectric layer on the interfacial layer, flowing a metal-containing precursor and a reactant over the high-K dielectric layer to deposit metal atoms on the high-K dielectric layer, and annealing the substrate to drive the metal atoms into an interface of the interfacial layer and the high-K dielectric layer to achieve desired dipole effect. In dipole last processes, instead of forming an ultrathin surface adsorption layer, an atomic layer deposition (ALD) process is performed to deposit a dipole layer having a thickness in a range of from 3 Å to 20 Å that contains the metal atoms, usually in their oxide or nitride form. A capping material is typically needed on top of the dipole oxide/nitride layer to avoid silicon oxide regrowth during the annealing process.

Conventional dipole first processes allow for $V_t$ tunability of greater than about 200 millivolts (mV), while conventional dipole last processes allow for $V_t$ tunability of less than about 200 mV. Accordingly, in conventional dipole last processes, multiple annealing steps would be required to reach an increased $V_t$, such as the $V_t$ achieved by a conventional dipole first process. By switching to a conventional dipole first process for greater $V_t$ tunability, multi-$V_t$ capability is lost because there are currently no known etch processes which can selectively remove dipole materials without removing a portion of the silicon oxide (SiOx) interfacial layer. Also, particularly in dipole first processes, there are challenges associated with $V_t$ shift and leakage.

Accordingly, there is a need for improved methods of manufacturing electronic devices that meet reduced thickness, reduced leakage, lower thermal budget, and $V_t$ requirements (including multi-$V_t$), and have minimal, if any, EOT penalty.

SUMMARY

One or more embodiments of the disclosure are directed to a method of manufacturing an electronic device. The method comprises forming a P-dipole stack and an N-dipole stack on a semiconductor substrate. Each of the P-dipole stack and the N-dipole stack are formed on a top surface of a channel located between a source and a drain on the semiconductor substrate. In some embodiments, forming each of the P-dipole stack and the N-dipole stack comprises: depositing an interfacial layer on the top surface of the channel; depositing a hafnium-containing layer on the interfacial layer, the hafnium-containing layer having a thickness of less than or equal to 5 Å; and depositing a dipole layer on the hafnium-containing layer.

Additional embodiments of the disclosure are directed to a method of manufacturing an electronic device. The method comprises forming a P-dipole stack and an N-dipole stack on a semiconductor substrate. Each of the P-dipole stack and the N-dipole stack are formed on a top surface of a channel located between a source and a drain on the semiconductor substrate. In some embodiments, forming each of the P-dipole stack and the N-dipole stack comprises: depositing an interfacial layer (e.g., silicon oxide (SiOx)) on the top surface of the channel; depositing a hafnium-containing layer on the interfacial layer, the hafnium-containing layer comprising hafnium oxide (HfOx) and having a thickness of less than or equal to 5 Å; and depositing a dipole layer comprising lanthanum nitride (LaN) on the hafnium-containing layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Figure 1:
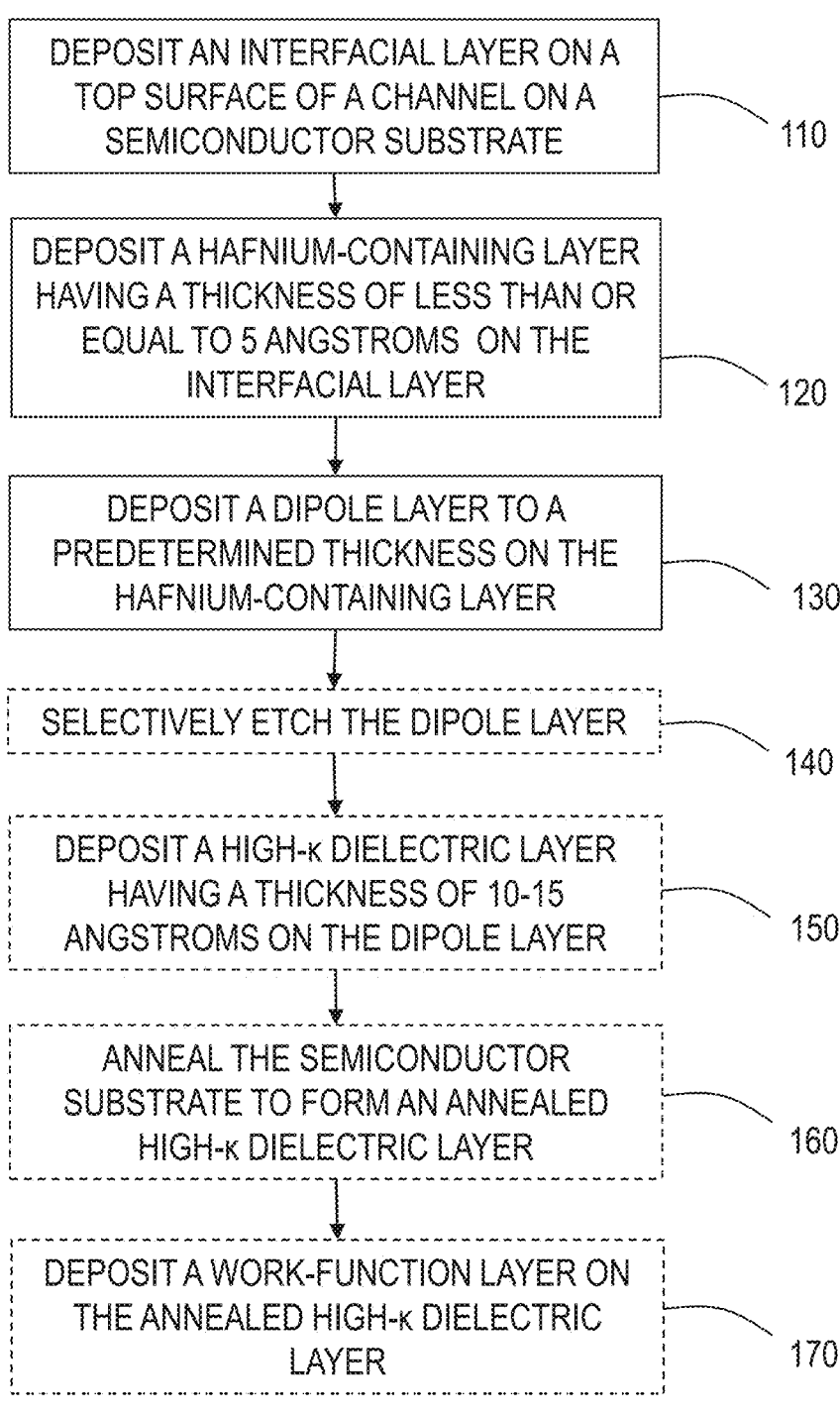
FIG. 1 illustrates a process flow diagram of a method of manufacturing an electronic device according to one or more embodiments of the present disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

The term "about" as used herein means approximately or nearly and in the context of a numerical value or range set forth means a variation of ±15%, or less, of the numerical value. For example, a value differing by ±14%, ±10%, ±5%, ±2%, or ±1%, would satisfy the definition of about.

As used in this specification and the appended claims, the term "substrate" or "wafer" refers to a surface, or portion of a surface, upon which a process acts. It will also be understood by those skilled in the art that reference to a substrate can refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus, for example, where a film/layer or partial film/layer has been deposited onto a substrate surface, the exposed surface of the newly deposited film/layer becomes the substrate surface.

The term "on" indicates that there is direct contact between elements. The term "directly on" indicates that there is direct contact between elements with no intervening elements.

As used in this specification and the appended claims, the terms "precursor", "reactant", "reactive gas" and the like are used interchangeably to refer to any gaseous species that can react with the substrate surface.

"Atomic layer deposition" or "cyclical deposition" as used herein refers to the sequential exposure of two or more reactive compounds to deposit a layer of material on a substrate surface. The substrate, or portion of the substrate, is exposed separately to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. These reactive compounds are said to be exposed to the substrate sequentially. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A) is pulsed into the reaction zone followed by a first time delay. Next, a second precursor or compound B is pulsed into the reaction zone followed by a second delay. During each time delay, a purge gas, such as argon, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the predetermined thickness.

One or more of the layers deposited on the substrate or substrate surface are continuous. As used herein, the term "continuous" refers to a layer that covers an entire exposed surface without gaps or bare spots that reveal material underlying the deposited layer. A continuous layer may have gaps or bare spots with a surface area less than about 15% or less than about 10% of the total surface area of the layer.

In an embodiment of a spatial ALD process, a first reactive gas and second reactive gas (e.g., nitrogen gas) are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

Transistors are circuit components or elements that are often formed on semiconductor devices. Depending upon the circuit design, in addition to capacitors, inductors, resistors, diodes, conductive lines, or other elements, transistors are formed on a semiconductor device. Generally, a transistor includes a gate formed between source and drain regions. In one or more embodiments, the source and drain regions include a doped region of a substrate, such as a semiconductor substrate, and exhibit a doping profile suitable for a particular application. The gate is positioned over the channel region and includes a gate dielectric interposed between a gate electrode and the channel region in the semiconductor substrate.

As used herein, the term "field effect transistor" or "FET" refers to a transistor that uses an electric field to control the electrical behavior of the device. Field effect transistors are voltage controlled devices where their current carrying ability is changed by applying an electric field. Field effect transistors generally display very high input impedance at low temperatures. The conductivity between the drain and source terminals is controlled by an electric field in the device, which is generated by a voltage difference between the body and the gate of the device. The FET's three terminals are source(S), through which the carriers enter the channel; drain (D), through which the carriers leave the channel; and gate (G), the terminal that modulates the channel conductivity. Conventionally, current entering the channel at the source(S) is designated Is and current entering the channel at the drain (D) is designated $I_D$. Drain-to-source voltage is designated $V_{DS}$. By applying voltage to gate (G), the current entering the channel at the drain (i.e. $I_D$) can be controlled.

The metal-oxide-semiconductor field-effect transistor (MOSFET) is a type of field-effect transistor (FET) and is used in integrated circuits and high speed switching applications. MOSFET has an insulated gate, whose voltage determines the conductivity of the device. This ability to change conductivity with the amount of applied voltage is used for amplifying or switching electronic signals. A MOSFET is based on the modulation of charge concentration by a metal-oxide-semiconductor (MOS) capacitance between a body electrode and a gate electrode located above the body and insulated from all other device regions by a gate dielectric layer. Compared to the MOS capacitor, the MOSFET includes two additional terminals (source and drain), each connected to individual highly doped regions that are separated by the body region. These regions can be either p or n type, but they are both of the same type, and of opposite type to the body region. The source and drain (unlike the body) are highly doped as signified by a "+" sign after the type of doping.

If the MOSFET is an n-channel or nMOS FET, then the source and drain are n+ regions and the body is a p-type substrate region. If the MOSFET is a p-channel or pMOS FET, then the source and drain are p+ regions and the body is a n-type substrate region. The source is so named because it is the source of the charge carriers (electrons for n-channel, holes for p-channel) that flow through the channel; similarly, the drain is where the charge carriers leave the channel.

A nMOS FET is made up of a n-type source and drain and a p-type substrate. When a voltage is applied to the gate, holes in the body (p-type substrate) are driven away from the gate. This allows forming an n-type channel between the source and the drain and a current is carried by electrons from source to the drain through an induced n-type channel. Logic gates and other digital devices implemented using NMOSs are said to have NMOS logic. There are three modes of operation in a NMOS called the cut-off, triode and saturation. Circuits with NMOS logic gates dissipate static power when the circuit is idling, since DC current flows through the logic gate when the output is low.

A pMOS FET is made up of p-type source and drain and a n-type substrate. When a positive voltage is applied between the source and the gate (negative voltage between gate and source), a p-type channel is formed between the source and the drain with opposite polarities. A current is carried by holes from source to the drain through an induced p-type channel. A high voltage on the gate will cause a PMOS not to conduct, while a low voltage on the gate will cause it to conduct. Logic gates and other digital devices implemented using PMOS are said have PMOS logic. PMOS technology is low cost and has a good noise immunity.

In a NMOS, carriers are electrons, while in a PMOS, carriers are holes. When a high voltage is applied to the gate, NMOS will conduct, while PMOS will not. Furthermore, when a low voltage is applied in the gate, NMOS will not conduct and PMOS will conduct. NMOS are considered to be faster than PMOS, since the carriers in NMOS, which are electrons, travel twice as fast as holes, which are the carriers in PMOS. But PMOS devices are more immune to noise than NMOS devices. Furthermore, NMOS ICs would be smaller than PMOS ICs (that give the same functionality), since the NMOS can provide one-half of the impedance provided by a PMOS (which has the same geometry and operating conditions).

As used herein, the term "fin field-effect transistor (Fin-FET)" refers to a MOSFET transistor built on a substrate where the gate is placed on two, three, or four sides of the channel or wrapped around the channel, forming a double gate structure. FinFET devices have been given the generic name FinFETs because the source/drain region forms "fins" on the substrate. FinFET devices have fast switching times and high current density.

As used herein, the term "gate all-around (GAA)," is used to refer to an electronic device, e.g., a transistor, in which the gate material surrounds the channel region on all sides. The channel region of a GAA transistor may include nano-wires or nano-slabs or nano-sheets, bar-shaped channels, or other suitable channel configurations known to one of skill in the art. In one or more embodiments, the channel region of a GAA device has multiple horizontal nanowires or horizontal bars vertically spaced, making the GAA transistor a stacked horizontal gate-all-around (hGAA) transistor.

As used herein, the term "nanowire" refers to a nanostructure, with a diameter on the order of a nanometer (10-9 meters). Nanowires can also be defined as the ratio of the length to width being greater than 1000. Alternatively, nanowires can be defined as structures having a thickness or diameter constrained to tens of nanometers or less and an unconstrained length. Nanowires are used in transistors and some laser applications, and, in one or more embodiments, are made of semiconducting materials, metallic materials, insulating materials, superconducting materials, or molecular materials. In one or more embodiments, nanowires are used in transistors for logic CPU, GPU, MPU, and volatile (e.g., DRAM) and non-volatile (e.g., NAND) devices. As used herein, the term "nanosheet" refers to a two-dimensional nanostructure with a thickness in a scale ranging from about 0.1 nm to about 1000 nm, or from 0.5 nm to 500 nm, or from 0.5 nm to 100 nm, or from 1 nm to 500 nm, or from 1 nm to 100 nm, or from 1 nm to 50 nm.

Embodiments of the present disclosure advantageously provide methods of manufacturing electronic devices that meet reduced thickness, reduced leakage, lower thermal budget, and $V_t$ requirements (including multi-$V_t$), and have improved device performance and reliability. Embodiments of the disclosure improve $V_t$ significantly without EOT penalty due to a new integration scheme. Embodiments of the disclosure include integration schemes that provide at least 300 mV $V_t$ tunability with minimum EOT increase.

Some embodiments advantageously provide methods that increase $V_t$ in one or more of a P-dipole stack or an N-dipole stack in an electronic device. Some embodiments advantageously provide methods that reduce leakage ($J_g$) in an electronic device.

Embodiments of the present disclosure advantageously provide improved dipole first type processes that allows for increased $V_t$ and improved multi-$V_t$ tuning ability. Embodiments of the present disclosure advantageously provide improved dipole first type processes that reduce the number of annealing steps to densify the high-K dielectric layer and drive-in metal atoms from the deposited dipole layer. Embodiments of the present disclosure relate to metal gate stacks (e.g., P-dipole stacks and N-dipole stacks) with improved bandedge performance, e.g., improved flatband voltage ($V_{fb}$), relative to conventional dipole first processes and conventional dipole last processes.

The embodiments of the disclosure are described by way of the Figures, which illustrate devices (e.g., transistors) and processes for forming transistors in accordance with one or more embodiments of the disclosure. The processes shown are merely illustrative possible uses for the disclosed processes, and the skilled artisan will recognize that the disclosed processes are not limited to the illustrated applications.

FIG. 1 illustrates a process flow diagram of a method 100 of manufacturing an electronic device according to one or more embodiments of the present disclosure. The method 100 includes forming a P-dipole stack and an N-dipole stack on a semiconductor substrate. Each of the P-dipole stack and the N-dipole stack are formed on a top surface of a channel located between a source and a drain on the semiconductor substrate. Forming each of the P-dipole stack and the N-dipole stack comprises: depositing an interfacial layer on the top surface of the channel (operation 110); depositing a hafnium-containing layer having a thickness of less than or equal to 5 Å on the interfacial layer (operation 120); and depositing a dipole layer to a predetermined thickness on the hafnium-containing layer (operation 130).

In some embodiments, at operation 110, the interfacial layer is deposited on the semiconductor substrate using a deposition technique, such as, but not limited to, ALD, CVD, PVD, MBE, MOCVD, spin-on, or other insulating layer deposition techniques known to the skilled artisan. In one or more embodiments, the interfacial layer comprises a silicon oxide (SiOx) layer formed on doped silicon or undoped silicon. In one or more embodiments, the interfacial layer may be formed by etching and an oxide forming on the surface.

In some embodiments, at operation 110, a wet chemistry technique is performed to form the interfacial layer. The wet chemistry technique may be any suitable technique known to the skilled artisan. In some embodiments, the wet chemistry technique includes a pre-clean process. In some embodiments, the pre-clean process includes using a SC-1 solution comprising one or more of ozone, ammonium hydroxide or hydrogen peroxide. In some embodiments, the pre-clean process includes using a SC-1 solution without ozone, ammonium hydroxide or hydrogen peroxide. In some embodiments, after using the SC-1 solution, the pre-clean process includes using dilute hydrofluoric acid (dilute HF), including greater than 100:1, such as 130:1 dilute HF, to etch away native oxide on the substrate to form a hydrophobic surface (i.e., the interfacial layer).

In some embodiments, at operation 110, a rapid thermal process (RTP) is used to form the interfacial layer. The RTP may be any suitable process known to the skilled artisan. In some embodiments, at operation 110, the RTP is a thermal oxidation process in which a silicon oxide (SiOx) layer is grown on the semiconductor substrate.

In some embodiments, at operation 120, the hafnium-containing layer is deposited on the interfacial layer using a deposition technique, such as, but not limited to, ALD, CVD, PVD, MBE, MOCVD, spin-on, or other insulating layer deposition techniques known to the skilled artisan. In some embodiments, at operation 120, the hafnium-containing layer is conformally deposited by ALD.

In some embodiments, the hafnium-containing layer comprises one or more of hafnium oxide (HfOx), hafnium zirconium oxide (HfZrOx), nitrogen-doped hafnium oxide (HfOx), or nitrogen-doped hafnium zirconium oxide (HfZrOx). In some embodiments, the hafnium-containing layer comprises hafnium oxide (HfOx).

Embodiments of the present disclosure advantageously provide a thin hafnium-containing layer that serves as a buffer layer between the interfacial layer and the dipole layer. Advantageously, as opposed to conventional dipole first processes, the thin hafnium-containing layer, such as a hafnium-containing layer having a thickness of less than or equal to 5 Å. In one or more embodiments, the hafnium-containing layer is continuous such that the hafnium-containing layer having a thickness of less than or equal to 5 Å covers an entire exposed surface (e.g., the interfacial layer) without gaps or bare spots that reveal material underlying the hafnium-containing layer.

The hafnium-containing layer may have any suitable thickness less than or equal to 5 Å such that the hafnium-containing layer remains continuous, as described herein, and prevents etching of the interfacial layer during removal of the dipole layer in a subsequent operation.

In some embodiments, at operation 130, the dipole layer is deposited on the hafnium-containing layer using a deposition technique, such as, but not limited to, ALD, CVD, PVD, MBE, MOCVD, spin-on, or other insulating layer deposition techniques known to the skilled artisan. The dipole layer comprises one or more of a metal layer, a metal oxide layer, or a metal nitride layer.

In some embodiments, at operation 130, depositing the dipole layer comprises exposing the semiconductor substrate to a pulse of a metal-containing precursor and a pulse of a hydrogen-containing reactant by an atomic layer deposition (ALD) process or a chemical vapor deposition (CVD) process. In some embodiments, the semiconductor substrate is purged after each pulse.

In some embodiments, at operation 130, depositing the dipole layer comprises exposing the semiconductor substrate to a pulse of a metal-containing precursor and a pulse of an oxygen-containing reactant by an atomic layer deposition (ALD) process or a chemical vapor deposition (CVD) process. In some embodiments, the semiconductor substrate is purged after each pulse.

In some embodiments, at operation 130, depositing the dipole layer comprises exposing the semiconductor substrate to a pulse of a metal-containing precursor and a pulse of a nitrogen-containing reactant by an atomic layer deposition (ALD) process or a chemical vapor deposition (CVD) process. In some embodiments, the semiconductor substrate is purged after each pulse.

In some embodiments, the metal-containing precursor comprises one or more of titanium (Ti), tantalum (Ta), aluminum (Al), niobium (Nb), antimony (Sb), tellurium (Te), germanium (Ge), gallium (Ga), lanthanum (La), yttrium (Y), strontium (Sr), scandium (Sc), or boron (B).

In some embodiments, the reactant is a hydrogen-reactant to form a dipole layer comprising a pure metal layer. In some embodiments, the reactant is an oxygen-containing reactant to form a dipole layer comprising a metal oxide layer. In some embodiments, the reactant is a nitrogen-containing reactant to form a dipole layer comprising a metal nitride layer.

In some embodiments, the hydrogen-containing reactant comprises one or more of hydrogen ($H_2$) or deuterium ($^2H$).

In some embodiments, the oxygen-containing reactant comprises one or more of oxygen ($O_2$), ozone ($O_3$), or water ($H_2O$).

In some embodiments, the nitrogen-containing reactant comprises one or more of nitrogen ($N_2$), ammonia ($NH_3$), hydrazine ($N_2H_4$), a co-flow of nitrogen radicals ($N_2$*) and hydrogen radicals (H*), a co-flow of nitrogen radicals ($N_2$*) and hydrogen ($H_2$) gas, or a co-flow of nitrogen radicals ($N_2$*) and deuterium ($^2H$) gas.

In some embodiments the nitrogen-containing reactant comprises a substituted or unsubstituted alkyl hydrazine. In some embodiments, the alkyl hydrazine comprises in a range of from 1 carbon to 6 carbons. In one or more embodiments, the alkyl hydrazine is t-butyl hydrazine. In some embodiments, the nitrogen-containing reactant comprises a plasma. In some embodiments, the nitrogen-containing reactant comprises ammonia ($NH_3$).

In one or more embodiments, the dipole layer on the N-dipole stack comprises lanthanum nitride (LaN). In one or more embodiments, the dipole layer on the P-dipole stack comprises aluminum nitride (AlN).

The dipole layer may be deposited as a single layer or as a multilayer film. The dipole layer may be deposited to a predetermined thickness.

The method 100 optionally includes, at operation 140, selectively etching the dipole layer. In one or more embodiments, the method includes selectively etching the dipole at operation 140 in order to form multiple threshold voltages (multi-$V_t$) in the electronic device.

Advantageously, as opposed to conventional dipole first processes, operation 140 allows selective removal of the dipole layer without removing a portion of the interfacial layer. In one or more embodiments, the method 100 includes, at operation 140, selectively etching the deposited dipole layer from one of the P-dipole stack or the N-dipole stack and increasing a thickness of the dipole layer on the other of the P-dipole stack or the N-dipole stack to form an electronic device with multiple threshold voltages (multi-$V_t$).

The etching process of operation 140 can be any suitable etching process known to the skilled artisan. In some embodiments, the etching process comprises a wet etch process or a dry etch process. In some embodiments, the etching process comprises a wet etch process. In some embodiments, the wet etch process includes a pre-clean process. In some embodiments, the pre-clean process includes using one or more of ammonium hydroxide ($NH_4OH$) or water ($H_2O$). In some embodiments, the water ($H_2O$) is de-ionized water (DI). In some embodiments, the pre-clean process includes using a ratio of DI:$NH_4OH$ in a range of from 100:1 DI:$NH_4OH$ to 5:1 DI:$NH_4OH$.

In some embodiments, the pre-clean process includes using a SC-1 solution or a SC-2 solution. In one or more embodiments, the SC-1 solution comprises one or more of ozone, ammonium hydroxide or hydrogen peroxide. In one or more embodiments, the SC-2 solution comprises one or more of hydrochloric aid or hydrogen peroxide. It has advantageously been found that using a SC-1 solution or a SC-2 solution for operation 140 selectively etches the deposited dipole layer from one of the P-dipole stack or the N-dipole stack without etching a portion of the interfacial layer.

It has also been found that selectively etching the deposited dipole layer from one of the P-dipole stack or the N-dipole stack, at operation 140, and increasing a thickness of the dipole layer on the other of the P-dipole stack or the N-dipole stack advantageously provides methods of multi-$V_t$ tuning of the electronic device.

For example, if the work-function was shifted in either P-dipole or N-dipole bandedge after dipole engineering, the methods herein can be used to shift the bandedge the opposite way. For example, methods described herein can shift the bandedge from ultra-low $V_t$ (ULV$_t$), which is the most P-dipole and/or N-dipole bandedge, respectively, to low $V_t$ (LV$_t$) or standard $V_t$ (SV$_t$), or the mid-gap: high $V_t$ (HV$_t$). In some embodiments, ULV$_t$ can be achieved by using a P-dipole and a P-metal in the P-dipole stack and an N-dipole and an N-metal in N-dipole stack. In some embodiments, the thickness of the dipole layer is chosen to form maximum dipole density at the interface of the interfacial layer and the hafnium-containing layer.

Without intending to be bound by theory, it is thought that selectively etching the deposited dipole layer from one of the P-dipole stack or the N-dipole stack and increasing a thickness of the dipole layer on the other of the P-dipole stack or the N-dipole stack to form an electronic device with multiple threshold voltages (multi-$V_t$). Stated differently, when the dipole layer on the P-dipole stack or the N-dipole stack has a first thickness and the dipole layer on the other of the P-dipole stack or the N-dipole stack has a second thickness, and the first thickness and the second thickness are different, multiple threshold voltages (multi-$V_t$) are formed.

In some embodiments, LV$_t$ can be achieved by using a P-metal or a P-dipole (thinner dipole layer) and a P-metal in the P-dipole stack and an N-metal or an N-dipole (thinner dipole layer) and an N-metal in the N-dipole stack. In some embodiments, SV$_t$ can be achieved by using a thin P-metal layer in the P-dipole stack or a thin N-metal layer in the N-dipole stack, using a combination of P-dipole and N-dipole of a predetermined thicknesses. In some embodiments, HV$_t$ can be achieved by a combination of P-Metal and N-Metal or a mid-gap work-function metal. In some embodiments, the mid-gap work-function metal includes any suitable metal material having a work-function from 4.4 to 4.6 eV. It has advantageously been found that, depending on the metal precursor that is chosen, the methods described herein can either decrease or increase the effective work function (eWF) of the film stack (e.g., the P-dipole stack and/or the N-dipole stack) in the semiconductor devices.

Thus, tuning of eWF can be done by using different mid-gap work-function metals. The mid-gap work-function metal can be chosen based on tuning the multi-$V_t$ requirements.

Figure 2A:
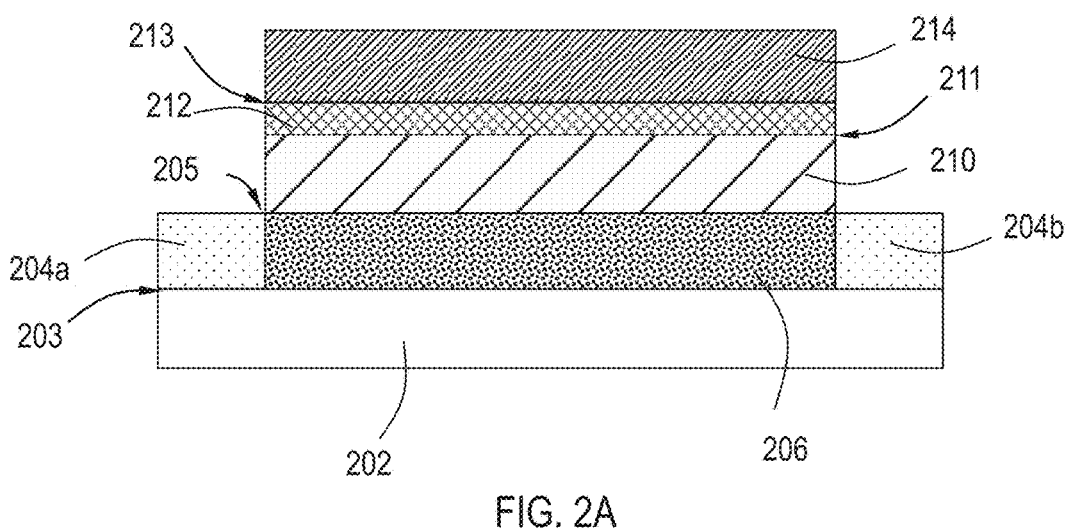
FIG. 2A illustrates a cross-sectional view of a semiconductor substrate according to one or more embodiments of the present disclosure.
Figure 2B:
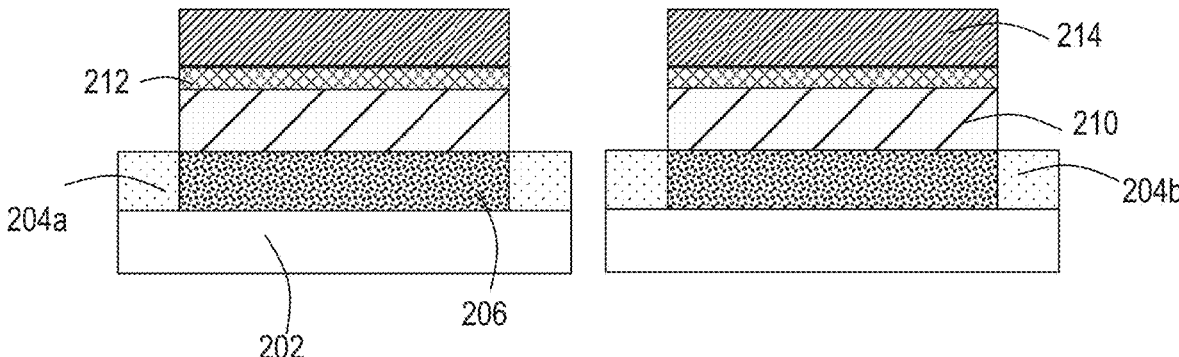
FIG. 2B illustrates a cross-sectional view of a semiconductor substrate according to one or more embodiments of the present disclosure.
Figure 2C:
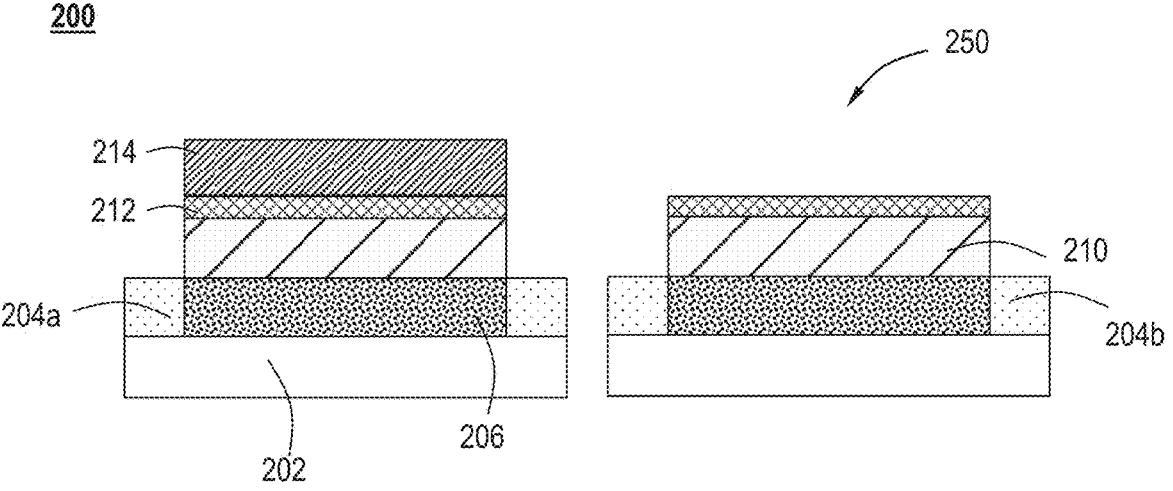
FIG. 2C illustrates a cross-sectional view of a semiconductor substrate according to one or more embodiments of the present disclosure.
Figure 2D:
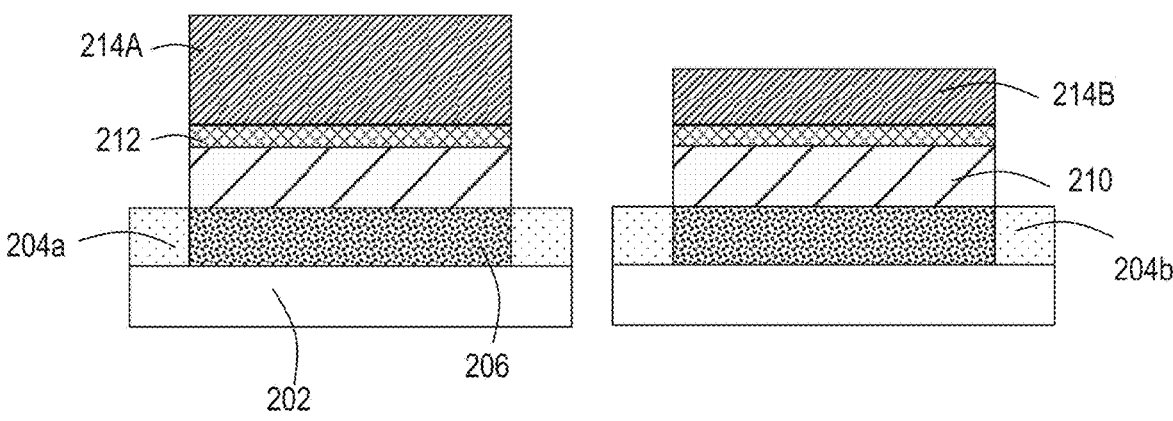
FIG. 2D illustrates a cross-sectional view of a substrate according to one or more embodiments of the present disclosure.
Figure 2E:
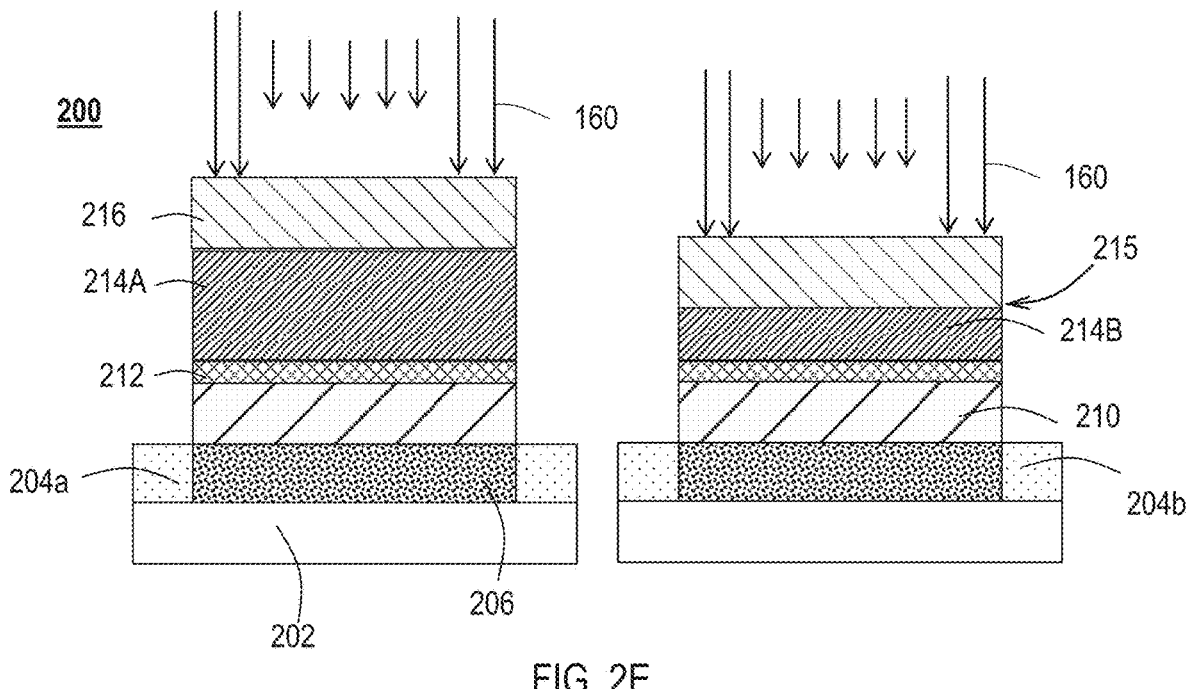
FIG. 2E illustrates a cross-sectional view of a semiconductor substrate according to one or more embodiments of the present disclosure.

Referring to FIGS. 1 and 2E, the method 100 optionally includes, at operation 150, depositing a high-K dielectric layer having a thickness in a range of from 10 Å to 20 Å on the dipole layer using a deposition technique, such as, but not limited to, ALD, CVD, PVD, MBE, MOCVD, spin-on, or other insulating layer deposition techniques known to the skilled artisan. In some embodiments, at operation 150, the high-K dielectric layer is conformally deposited by ALD.

The high-K dielectric layer comprises one or more of hafnium oxide (HfOx), hafnium zirconium oxide (HfZrOx), zirconium oxide (ZrOx), nitrogen-doped hafnium oxide (HfOx), nitrogen-doped hafnium zirconium oxide (HfZrOx), and nitrogen-doped zirconium oxide (ZrOx). In one or more embodiments, the electronic device includes a hafnium-containing layer comprising hafnium oxide (HfOx) (having a thickness of less than or equal to 5 Å) on the interfacial layer, and a high-dielectric layer comprising hafnium oxide (HfOx) (having a thickness in a range of from 10 Å to 20 Å) on the dipole layer.

Referring again to FIGS. 1 and 2E, the method 100 optionally includes, at operation 160, annealing the P-dipole stack and the N-dipole stack (denoted by the arrows) at a temperature of less than or equal to 1000° C. to drive in metal atoms from the dipole layer and densify the high-K dielectric layer to form an annealed high-K dielectric layer. In some embodiments, at operation 160, the method 100 comprises annealing the P-dipole stack and the N-dipole stack at a temperature of less than or equal to 950° C. In some embodiments, the temperature is in a range of from 500° C. to 1000° C., including in a range of from 600° C. to 1000° C., in a range of from 700° C. to 1000° C., in a range of from 750° C. to 950° C., or in a range of from 800° C. to 900° C.

Without intending to be bound by theory, it is thought that annealing the semiconductor substrate according to operation 160 drives an increased number of atoms from the dipole layer into the interface of the interfacial layer and the hafnium-containing layer, as compared to methods where annealing does not occur. In one or more embodiments, annealing the semiconductor substrate at operation 160 includes a rapid thermal process (RTP). The RTP may be any suitable process known to the skilled artisan. Without intending to be bound by theory, the RTP is believed to densify and improve the physical properties of the deposited dipole layer. Without intending to be bound by theory, when, at operation 160, the method 100 comprises annealing the semiconductor substrate at a temperature of less than or equal to 1000° C. to drive atoms from the dipole layer into the interface of the interfacial layer and the hafnium-containing layer, such that the interface of the interfacial layer and the hafnium-containing layer comprises properties of the dipole layer.

Without intending to be bound by theory, it is thought that a dipole region comprising a channel having n-type material or p-type material, and a dipole layer as described above, simplifies the existing integration flow, reducing the integration costs. Additionally, when atoms (such as metal atoms) from the dipole layer are embedded in the interfacial layer and/or the hafnium-containing layer, the dipole region is formed and it is thought that oxidation can be reduced, which would potentially reduce the annealing temperature required.

Figure 2F:
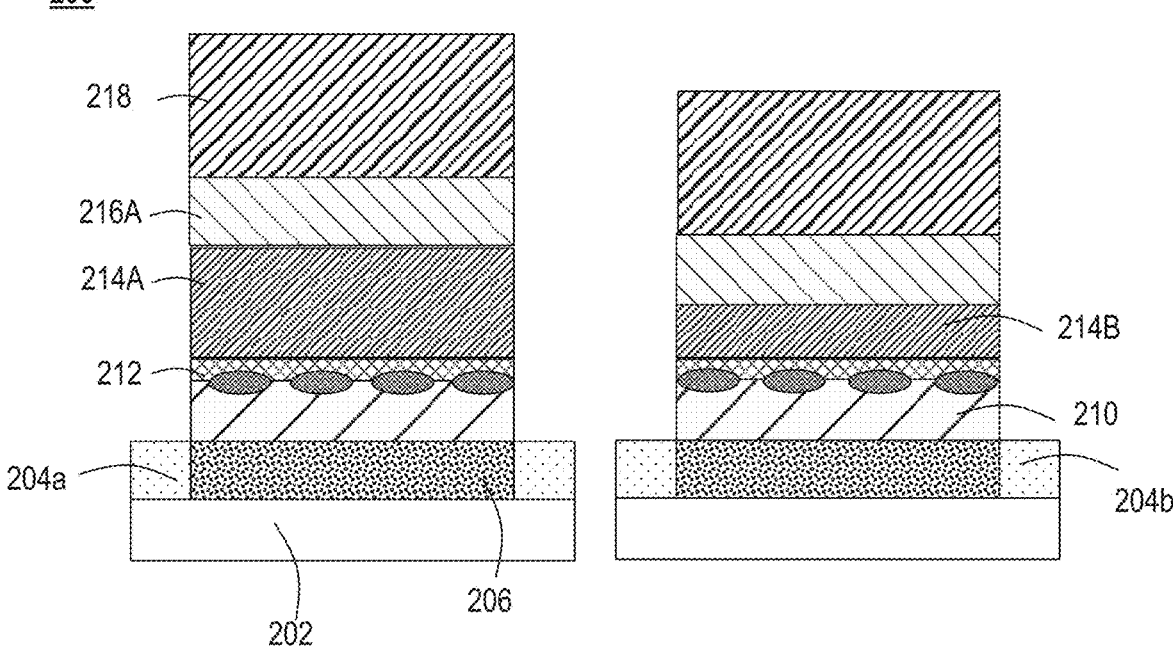
FIG. 2F illustrates a cross-sectional view of a semiconductor substrate according to one or more embodiments of the present disclosure.

Referring to FIGS. 1 and 2F, the method 100 optionally includes, at operation 170, depositing a work-function layer or a mid-gap fill layer on the annealed high-K dielectric layer. In some embodiments, at operation 170, the work-function layer is deposited on the annealed high-K dielectric layer using a deposition technique, such as, but not limited to, ALD, CVD, PVD, MBE, MOCVD, spin-on, or other insulating layer deposition techniques known to the skilled artisan.

The work-function layer may comprise any suitable metal known to the skilled artisan. In some embodiments, the work-function layer comprises one or more of a P-metal or an N-metal. In some embodiments, the work-function layer comprises a P-metal. In embodiments where the work-function layer comprises a P-metal, the P-metal includes any suitable high electronegativity metal nitride material. In some embodiments, the P-metal comprises one or more of titanium nitride (TiN), titanium oxynitride (TiON), molybdenum nitride (MoN), molybdenum oxynitride (MoON), or niobium nitride (NbN).

In some embodiments, the work-function layer comprises an N-metal. In embodiments where the work-function layer comprises an N-metal, the n-metal includes any suitable electropositive refractive metals. In some embodiments, the N-metal comprises a lanthanide, carbides thereof, nitrides thereof, alloys thereof with electropositive refractive metals, titanium aluminum (TiAl), tantalum aluminum (TaAl), niobium aluminum (NbAl), or zirconium aluminum (ZrAl).

In one or more embodiments, the work-function layer has a thickness in a range of from less than or equal to 2 nm to less than or equal to 3 nm.

FIG. 2A-2F are cross-sectional views of an electronic device (e.g., a transistor such as a FinFET or GAA) 200 according to one or more embodiments. The electronic devices 200 shown in FIGS. 2A-2F may be manufactured by the method 100 illustrated in FIG. 1.

Referring to FIGS. 2A and 2B, in one or more embodiments, the electronic device 200 comprises a semiconductor substrate 202 having a top surface 203. The semiconductor substrate 202 can be any suitable substrate material. In one or more embodiments, the semiconductor substrate 202 comprises a semiconductor material, e.g., silicon (Si), carbon (C), germanium (Ge), silicon germanium (SiGe), gallium arsenide (GaAs), indium phosphate (InP), indium gallium arsenide (InGaAs), indium aluminum arsenide (InAlAs), germanium (Ge), silicon germanium (SiGe), other semiconductor materials, or any combination thereof. In one or more embodiments, the semiconductor substrate 202 comprises one or more of silicon (Si), germanium (Ge), gallium (Ga), arsenic (As), indium (In), phosphorus (P), or selenium (Se). Although a few examples of materials from which the substrate 202 may be formed are described herein, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present disclosure.

In one or more embodiments, the semiconductor substrate 202 is a p-type or n-type substrate. As used herein, the term "n-type" refers to semiconductors that are created by doping an intrinsic semiconductor with an electron donor element during manufacture. The term n-type comes from the negative charge of the electron. In n-type semiconductors, electrons are the majority carriers and holes are the minority carriers. As used herein, the term "p-type" refers to the positive charge of a well (or hole). As opposed to n-type semiconductors, p-type semiconductors have a larger hole concentration than electron concentration. In p-type semi-conductors, holes are the majority carriers and electrons are the minority carriers.

In one or more embodiments, a source region 204a is on the top surface 203 of the semiconductor substrate 202. In one or more embodiments, the source region 204a has a source and a source contact (not illustrated). A drain region 204b is on the top surface 203 of the semiconductor substrate 202 opposite the source region 204a. In one or more embodiments, the drain region 204b has a drain and a drain contact (not illustrated).

In one or more embodiments, the source region 204a and/or the drain region 204b can be any suitable material known to the skilled artisan. In one or more embodiments, the source region 204a and/or the drain region 204b may have more than one layer. For example, the source region 204a and/or the drain region 204b may independently comprise three layers. In one or more embodiments, the source region 204a and the drain region 204b may independently comprise one or more of copper (Cu), cobalt (Co), tungsten (W), titanium (Ti), molybdenum (Mo), nickel (Ni), ruthenium (Ru), silver (Ag), gold (Au), iridium (Ir), platinum (Pt), phosphorus (P), germanium (Ge), silicon (Si), aluminum (Al), or zirconium (Zr). In some embodiments, the source region 204a and the drain region 204b may independently comprise a bottom layer of silicon with doped epi (e.g., SiGe, SiP, and the like), a second layer of silicide, which may contain nickel (Ni), titanium (Ti), aluminum (Al), and the like, and a third, or top, layer which may be a metal such as, but not limited to, cobalt, tungsten, ruthenium, and the like. In some embodiments, the source region 204a and the drain region 204b may be raised source/drain regions formed by EPI growth.

In one or more embodiments, the source contact and/or the drain contact may independently be selected from one or more of nitrogen (N), copper (Cu), cobalt (Co), tungsten (W), titanium (Ti), molybdenum (Mo), nickel (Ni), ruthenium (Ru), silver (Ag), gold (Au), iridium (Ir), tantalum (Ta), or platinum (Pt). In one or more embodiments, formation of the source contact and/or the drain contact is conducted by any suitable process known to the skilled artisan, including, but not limited to ALD, CVD, PVD, MBE, MOCVD, spin-on, or other insulating layer deposition techniques known to the skilled artisan.

In one or more embodiments, a channel 206 is located between the source 204a and the drain 204b. In one or more embodiments, at operation 110, an interfacial layer 210 is deposited on a top surface 205 of the channel 206. In one or more embodiments, the interfacial layer 210 can be any suitable material known to the skilled artisan. For example, in one or more embodiments, the interfacial layer 210 comprises a silicon oxide (SiOx) layer formed on doped silicon or undoped silicon. In one or more embodiments, the interfacial layer 210 comprises silicon dioxide ($SiO_2$). In other embodiments, the dielectric material is a low-K material. In one or more embodiments, the interfacial layer 210 may be formed on the top surface 205 of the channel 206 by any of the processes described herein with respect to operation 110. In one or more embodiments, the interfacial layer 210 has a thickness in a range of 1 Å to 10 Å.

In one or more embodiments, at operation 120, a hafnium-containing layer 212 is deposited on a top surface 211 of the interfacial layer 210 using a deposition technique, such as, but not limited to, ALD, CVD, PVD, MBE, MOCVD, spin-on, or other insulating layer deposition techniques known to the skilled artisan. In some embodiments, at operation 120, the hafnium-containing layer 212 is conformally deposited by ALD.

In some embodiments, the hafnium-containing layer 212 comprises one or more of hafnium oxide (HfOx), hafnium zirconium oxide (HfZrOx), nitrogen-doped hafnium oxide (HfOx), or nitrogen-doped hafnium zirconium oxide (HfZrOx). In some embodiments, the hafnium-containing layer 212 comprises hafnium oxide (HfOx).

Embodiments of the present disclosure advantageously provide a thin hafnium-containing layer 212 that serves as a buffer layer between the interfacial layer 210 and the dipole layer 214. Advantageously, as opposed to conventional dipole first processes, the thin hafnium containing layer, such as a hafnium-containing layer 212 having a thickness of less than or equal to 5 Å. In one or more embodiments, the hafnium-containing layer 212 is continuous such that the hafnium-containing layer 212 having a thickness of less than or equal to 5 Å covers an entire exposed surface (e.g., the interfacial layer 210) without gaps or bare spots that reveal material underlying the hafnium-containing layer 212.

The hafnium-containing layer 212 may have any suitable thickness less than or equal to 5 Å such that the hafnium-containing layer 212 remains continuous, as described herein, and prevents etching of the interfacial layer 210 during removal of the dipole layer 214 in a subsequent operation.

In some embodiments, at operation 130, the dipole layer 214 is deposited on a top surface 213 of the hafnium-containing layer 212 using a deposition technique, such as, but not limited to, ALD, CVD, PVD, MBE, MOCVD, spin-on, or other insulating layer deposition techniques known to the skilled artisan.

The dipole layer 214 comprises one or more of a metal layer, a metal oxide layer, or a metal nitride layer.

In some embodiments, at operation 130, depositing the dipole layer 214 comprises exposing the semiconductor substrate 202 to a pulse of a metal-containing precursor and a pulse of a reactant by an atomic layer deposition (ALD) process or a chemical vapor deposition (CVD) process. In some embodiments, the semiconductor substrate 202 is purged after each pulse.

In some embodiments, the reactant is a hydrogen-reactant to form a dipole layer 214 comprising a pure metal layer. In some embodiments, the reactant is an oxygen-containing reactant to form a dipole layer 214 comprising a metal oxide layer. In some embodiments, the reactant is a nitrogen-containing reactant to form a dipole layer 214 comprising a metal nitride layer.

In one or more specific embodiments, the dipole layer 214 is deposited by atomic layer deposition (ALD). In one or more embodiments, the dipole layer 214 is deposited by atomic layer deposition (ALD) at a temperature in the range of about 200° C. to about 600° C. In one or more embodiments, the dipole layer 214 is deposited by atomic layer deposition (ALD) at a temperature less than or equal to about 450° C. In one or more embodiments, the dipole layer has a thickness in a range of 1 Å to 10 Å, or in a range of 2 Å to 5 Å. In one or more specific embodiments, the dipole layer has a thickness in a range of 3 Å to 4 Å.

In FIG. 2B, an N-dipole stack and a P-dipole stack are shown. In one or more embodiments, the stack on the left side of FIG. 2B is the N-dipole stack and the stack on the right side of FIG. 2B is the P-dipole stack. The skilled artisan recognizes that the either the left side or the right side may comprise either of the N-dipole stack or the P-dipole stack, and the disclosure is not limited to the illustrated embodiment of FIG. 2B.

In one or more embodiments, the channel 206 comprises n-type material and the dipole layer 214 comprises one or more of lanthanum (La), cerium (Ce), praseodymium (Pr), neodymium (Nd), promethium (Pm), samarium (Sm), europium (Eu), gadolinium (Gd), terbium (Tb), dysprosium (Dy) holmium (Ho), erbium (Er), thulium (Tm), ytterbium (Yb), lutetium (Lu), magnesium (Mg), scandium (Sc), strontium (Sr), yttrium (Y), zirconium (Zr), or caesium (Cs).

In one or more embodiments, the channel 206 comprises p-type material and the dipole layer 214 comprises one or more of aluminum (Al), titanium (Ti), gallium (Ga), germanium (Ge), selenium (Se), indium (In), tin (Sn), antimony (Sb), tellurium (Te), tantalum (Ta), tungsten (W), or molybdenum (Mo).

In some embodiments, the metal-containing precursor comprises one or more of titanium (Ti), tantalum (Ta), aluminum (Al), niobium (Nb), antimony (Sb), tellurium (Te), germanium (Ge), gallium (Ga), lanthanum (La), yttrium (Y), strontium (Sr), scandium (Sc), or boron (B).

In some embodiments, the hydrogen-containing reactant comprises one or more of hydrogen ($H_2$) or deuterium ($^2H$).

In some embodiments, the oxygen-containing reactant comprises one or more of oxygen ($O_2$), ozone ($O_3$), or water ($H_2O$).

In some embodiments, the nitrogen-containing reactant comprises one or more of nitrogen ($N_2$), ammonia ($NH_3$), hydrazine ($N_2H_4$), a co-flow of nitrogen radicals ($N_2*$) and hydrogen radicals ($H*$), a co-flow of nitrogen radicals ($N_2*$) and hydrogen ($H_2$) gas, or a co-flow of nitrogen radicals ($N_2*$) and deuterium ($^2H$) gas.

In some embodiments the nitrogen-containing reactant comprises a substituted or unsubstituted alkyl hydrazine. In some embodiments, the alkyl hydrazine comprises in a range of from 1 carbon to 6 carbons. In one or more embodiments, the alkyl hydrazine is t-butyl hydrazine. In some embodiments, the nitrogen-containing reactant comprises a plasma. In some embodiments, the nitrogen-containing reactant comprises ammonia ($NH_3$).

In one or more embodiments, the channel 206 comprises n-type material and the dipole layer 214 comprises lanthanum nitride (LaN) on the N-dipole stack. In one or more embodiments, the channel 206 comprises p-type material and the dipole layer 214 comprises aluminum (Al) on the P-dipole stack.

The dipole layer 214 may be deposited as a single layer or as a multilayer film. The dipole layer 214 may be deposited to a predetermined thickness.

Referring to FIG. 2C, in one or more embodiments, the dipole layer 214 on the PFET side 250 is removed by a selective etching process at operation 140 of method 100. Advantageously, as opposed to conventional dipole first processes, operation 140 allows selective removal of the dipole layer 214 without removing a portion of the interfacial layer 210.

In one or more embodiments, the method 100 includes, at operation 140, selectively etching the deposited dipole layer 214 from one of the P-dipole stack or the N-dipole stack and increasing a thickness of the dipole layer 214 (to form dipole layer 214A and dipole layer 214B) on the other of the P-dipole stack or the N-dipole stack to form an electronic device with multiple threshold voltages (multi-$V_t$).

The etching process of operation 140 can be any suitable etching process known to the skilled artisan. In some embodiments, the etching process comprises a wet etch process or a dry etch process. In some embodiments, the etching process comprises a wet etch process. In some embodiments, the wet etch process includes a pre-clean process. In some embodiments, the pre-clean process includes using one or more of ammonium hydroxide ($NH_4OH$) or water ($H_2O$). In some embodiments, the water ($H_2O$) is de-ionized water (DI). In some embodiments, the pre-clean process includes using a ratio of DI:$NH_4OH$ in a range of from 100:1 DI:$NH_4OH$ to 5:1 DI:$NH_4OH$.

In some embodiments, the pre-clean process includes using a SC-1 solution or a SC-2 solution. In one or more embodiments, the SC-1 solution comprises one or more of ozone, ammonium hydroxide or hydrogen peroxide. In one or more embodiments, the SC-2 solution comprises one or more of hydrochloric aid or hydrogen peroxide. It has advantageously been found that using a SC-1 solution or a SC-2 solution for operation 140 selectively etches the deposited dipole layer 214 from one of the P-dipole stack or the N-dipole stack without etching a portion of the interfacial layer 210.

It has also been found that selectively etching the deposited dipole layer 214 from one of the P-dipole stack or the N-dipole stack, at operation 140, and increasing a thickness of the dipole layer (to form dipole layer 214A and dipole layer 214B) on the other of the P-dipole stack or the N-dipole stack advantageously provides methods of multi-$V_t$ tuning of the electronic device 200.

FIG. 2D illustrates an electronic device 200 having multiple threshold voltages (multi-$V_t$). In one or more embodiments, the stack on the left side of FIG. 2D is the N-dipole stack and the stack on the right side of FIG. 2D is the P-dipole stack. The skilled artisan recognizes that the either the left side or the right side may comprise either of the N-dipole stack or the P-dipole stack, and the disclosure is not limited to the illustrated embodiments of the Figures.

In FIG. 2D, dipole layer 214A on the N-dipole stack has a first thickness and dipole layer 214B on the P-dipole stack has a second thickness. The first thickness of the dipole layer 214A and the second thickness of the dipole layer 214B are different. In the illustrated embodiment of FIG. 2D, the first thickness of the dipole layer 214A is greater than the second thickness of the dipole layer 214B. In one or more embodiments, the first thickness is in a range of 10 Å to 20 Å and the second thickness is in a range of 1 Å to 10 Å. While the illustrated embodiment of FIG. 2D illustrates two dipole layer thicknesses, the first thickness of the dipole layer 214A and the second thickness of the dipole layer 214B, the disclosure is not limited thereto. Stated differently, the electronic device 200 may include any suitable number of different dipole layer thicknesses and multiple threshold voltages (multi-$V_t$). In one or more unillustrated embodiments, the electronic device 200 includes three different dipole layer thicknesses and three multiple threshold voltages (multi-$V_t$). In one or more unillustrated embodiments, the electronic device 200 includes four different dipole layer thicknesses and four multiple threshold voltages (multi-$V_t$).

Embodiments of the present disclosure advantageously provide improved dipole first type processes that allows for increased $V_t$ and improved multi-$V_t$ tuning ability. In specific embodiments, the electronic device 200 includes two different dipole layer thicknesses and two multiple threshold voltages (multi-$V_t$). In one or more embodiments, the method 100 is performed to form a dipole layer comprising lanthanum nitride (LaN) and having a $V_t$ of 400 mV. In one or more specific embodiments, the thickness of the dipole layer comprising lanthanum nitride (LaN) and having a $V_t$ of 400 mV defines a first thickness, and a dipole last process is performed to form a dipole layer having a second thickness that is different than the first thickness to achieve multi-$V_t$.

It has been found that selectively etching the deposited dipole layer 214 from one of the P-dipole stack or the N-dipole stack, at operation 140, and increasing a thickness of the dipole layer (to form dipole layer 214A and dipole layer 214B) on the other of the P-dipole stack or the N-dipole stack advantageously provides methods of multi-$V_t$ tuning of the electronic device 200.

Referring to FIGS. 1 and 2E, in one or more embodiments, the method 100 optionally includes, at operation 150, depositing a high-K dielectric layer 216 having a thickness in a range of from 10 Å to 20 Å on a top surface 215 of the dipole layer 214, such as dipole layer 214A and/or dipole layer 214B, by using a deposition technique, such as, but not limited to, ALD, CVD, PVD, MBE, MOCVD, spin-on, or other insulating layer deposition techniques known to the skilled artisan. In some embodiments, at operation 150, the high-K dielectric layer 216 is conformally deposited by ALD. The high-K dielectric layer 216 comprises one or more of hafnium oxide (HfOx), hafnium zirconium oxide (HfZrOx), zirconium oxide (ZrOx), nitrogen-doped hafnium oxide (HfOx), nitrogen-doped hafnium zirconium oxide (HfZrOx), and nitrogen-doped zirconium oxide (ZrOx). In one or more embodiments, the electronic device 200 includes a hafnium-containing layer 212 comprising hafnium oxide (HfOx) (having a thickness of less than or equal to 5 Å) on the interfacial layer 210, and a high-K dielectric layer 216 comprising hafnium oxide (HfOx) (having a thickness in a range of from 10 Å to 20 Å) on the dipole layer 214.

FIGS. 1 and 2E also illustrate operation 160 (denoted by the arrows), which includes annealing the P-dipole stack and the N-dipole stack at a temperature of less than or equal to 1000° C. to drive in metal atoms from the dipole layer 214 and densify the high-K dielectric layer 216 to form an annealed high-K dielectric layer 216A (shown in FIG. 2F). The metal atoms from the dipole layer 214 (denoted by the ovals in FIG. 2F) form at an interface of the interfacial layer 210 and the hafnium-containing layer 212 (e.g., on the top surface 213 of the hafnium-containing layer 212).

Referring to FIGS. 1 and 2F, the method 100 optionally includes, at operation 170, depositing a work-function layer 218 on the annealed high-K dielectric layer 216A.

In some embodiments, at operation 170, the work-function layer 218 is deposited on the annealed high-K dielectric layer 216A using a deposition technique, such as, but not limited to, ALD, CVD, PVD, MBE, MOCVD, spin-on, or other insulating layer deposition techniques known to the skilled artisan.

The work-function layer 218 may comprise any suitable metal known to the skilled artisan. In some embodiments, the work-function layer 218 comprises one or more of a P-metal or an N-metal. In some embodiments, the work-function layer 218 comprises a P-metal. In embodiments where the work-function layer 218 comprises a P-metal, the P-metal includes any suitable high electronegativity metal nitride material. In some embodiments, the P-metal comprises one or more of titanium nitride (TiN), titanium oxynitride (TiON), molybdenum nitride (MoN), molybdenum oxynitride (MoON), or niobium nitride (NbN).

In some embodiments, the work-function layer 218 comprises an N-metal. In embodiments where the work-function layer 218 comprises an N-metal, the n-metal includes any suitable electropositive refractive metals. In some embodiments, the N-metal comprises a lanthanide, carbides thereof, nitrides thereof, alloys thereof with electropositive refractive metals, titanium aluminum (TiAl), tantalum aluminum (TaAl), niobium aluminum (NbAl), or zirconium aluminum (ZrAl).

In one or more embodiments, the work-function layer 218 has a thickness in a range of from less than or equal to 2 nm to less than or equal to 3 nm.

Figure 3:
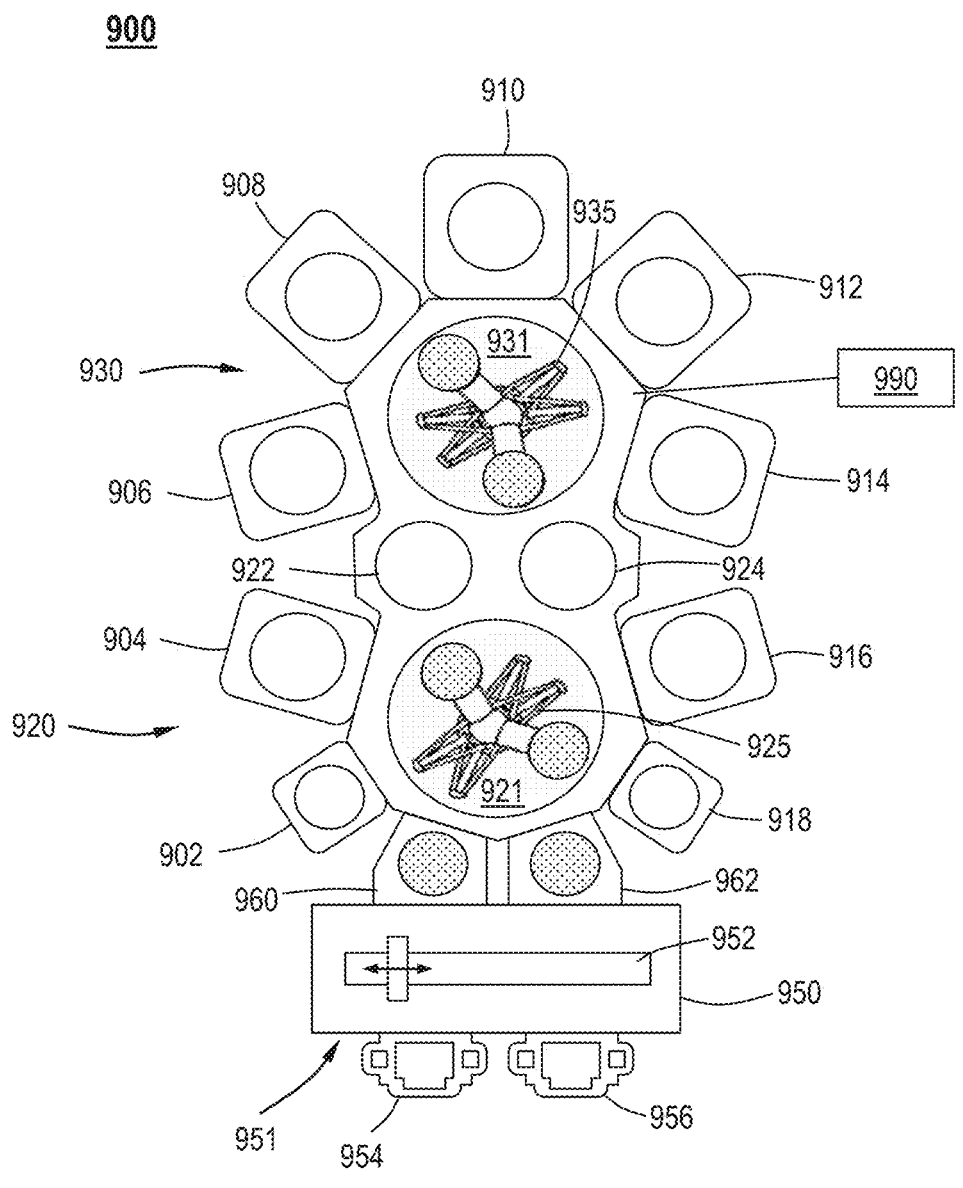
FIG. 3 illustrates a cluster tool according to one or more embodiments of the present disclosure.

Additional embodiments of the disclosure are directed to processing tools (i.e., a cluster tool) 900 for the formation of the logic/memory devices and methods described, as shown in FIG. 3. The cluster tool 900 includes at least one central transfer station 921, 931 with a plurality of sides. A robot 925, 935 is positioned within the central transfer station 921, 931 and is configured to move a robot blade and a wafer to each of the plurality of sides.

The cluster tool 900 comprises a plurality of processing chambers 902, 904, 906, 908, 910, 912, 914, 916, and 918, also referred to as process stations, connected to the central transfer station 921, 931. The various processing chambers provide separate processing regions isolated from adjacent process stations. The processing chamber can be any suitable chamber including, but not limited to, a preclean chamber, a buffer chamber, transfer space(s), a wafer orienter/degas chamber, a cryo cooling chamber, a deposition chamber, annealing chamber, etching chamber, a thermal processing (RTP) chamber, a plasma oxidation chamber, a plasma nitridation chamber, and an atomic layer deposition (ALD) chamber. In one or more embodiments, the ALD chamber includes a single chamber for depositing an interfacial layer on the top surface of the channel (operation 110); depositing a hafnium-containing layer having a thickness of less than or equal to 5 Å on the interfacial layer (operation 120); and depositing a dipole layer to a predetermined thickness on the hafnium-containing layer (operation 130), such that there is no vacuum break in between the operations.

In one or more embodiments, the ALD chamber can include a single chamber for each of depositing an interfacial layer on the top surface of the channel (operation 110); depositing a hafnium-containing layer having a thickness of less than or equal to 5 Å on the interfacial layer (operation 120); and depositing a dipole layer to a predetermined thickness on the hafnium-containing layer (operation 130), such that there is a vacuum break in between at least one of the operations.

The particular arrangement of process chambers and components can be varied depending on the cluster tool and should not be taken as limiting the scope of the disclosure.

In one or more embodiments, the cluster tool 900 includes a silicon dioxide ($SiO_2$) chamber to deposit silicon dioxide ($SiO_2$). The silicon dioxide ($SiO_2$) deposition chamber of some embodiments comprises an atomic layer deposition chamber, a plasma enhanced atomic layer deposition chamber, or a spatial atomic layer deposition chamber. In one or more embodiments, the cluster tool 900 includes a pre-cleaning chamber connected to the central transfer station.

In the embodiment shown in FIG. 3, a factory interface 950 is connected to a front of the cluster tool 900. The factory interface 950 includes a loading chamber 954 and an unloading chamber 956 on a front 951 of the factory interface 950. While the loading chamber 954 is shown on the left and the unloading chamber 956 is shown on the right, those skilled in the art will understand that this is merely representative of one possible configuration.

The size and shape of the loading chamber 954 and unloading chamber 956 can vary depending on, for example, the substrates being processed in the cluster tool 900. In the embodiment shown, the loading chamber 954 and unloading chamber 956 are sized to hold a wafer cassette with a plurality of wafers positioned within the cassette.

A robot 952 is within the factory interface 950 and can move between the loading chamber 954 and the unloading chamber 956. The robot 952 is capable of transferring a wafer from a cassette in the loading chamber 954 through the factory interface 950 to load lock chamber 960. The robot 952 is also capable of transferring a wafer from the load lock chamber 962 through the factory interface 950 to a cassette in the unloading chamber 956. As will be understood by those skilled in the art, the factory interface 950 can have more than one robot 952. For example, the factory interface 950 may have a first robot that transfers wafers between the loading chamber 954 and load lock chamber 960, and a second robot that transfers wafers between the load lock 962 and the unloading chamber 956.

The cluster tool 900 shown in FIG. 3 has a first section 920 and a second section 930. The first section 920 is connected to the factory interface 950 through load lock chambers 960, 962. The first section 920 includes a first transfer chamber 921 with at least one robot 925 positioned therein. The robot 925 is also referred to as a robotic wafer transport mechanism. The first transfer chamber 921 is centrally located with respect to the load lock chambers 960, 962, process chambers 902, 904, 916, 918, and buffer chambers 922, 924. The robot 925 of some embodiments is a multi-arm robot capable of independently moving more than one wafer at a time. In one or more embodiments, the first transfer chamber 921 comprises more than one robotic wafer transfer mechanism. The robot 925 in first transfer chamber 921 is configured to move wafers between the chambers around the first transfer chamber 921. Individual wafers are carried upon a wafer transport blade that is located at a distal end of the first robotic mechanism.

After processing a wafer in the first section 920, the wafer can be passed to the second section 930 through a pass-through chamber. For example, chambers 922, 924 can be uni-directional or bi-directional pass-through chambers. The pass-through chambers 922, 924 can be used, for example, to cryo cool the wafer before processing in the second section 930 or to allow wafer cooling or post-processing before moving back to the first section 920.

A system controller 990 is in communication with the first robot 925, second robot 935, first plurality of processing chambers 902, 904, 916, 918 and second plurality of processing chambers 906, 908, 910, 912, 914. The system controller 990 can be any suitable component that can control the processing chambers and robots. For example, the system controller 990 can be a computer including a central processing unit, memory, suitable circuits, and storage.

Processes may generally be stored in the memory of the system controller 990 as a software routine that, when executed by the processor, causes the process chamber to perform processes of the present disclosure. The software routine may also be stored and/or executed by a second processor (not shown) that is remotely located from the hardware being controlled by the processor. Some or all of the methods, such as method 100, of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general-purpose computer into a specific purpose computer (controller) that controls the chamber operation such that the processes are performed.

Embodiments of the disclosure are directed to a non-transitory computer readable medium. In one or more embodiments, the non-transitory computer readable medium includes instructions that, when executed by a controller of a processing chamber, causes the processing chamber to perform the operations of any of the methods described herein. In one or more embodiments, the controller causes the processing chamber to perform the operations of method 100.

In one or more embodiments, the processing tool 900 comprises a central transfer station 921, 931 comprising at least one robot 925, 935 configured to move a wafer; one or more of a rapid thermal processing (RTP) station, a decoupled plasma oxidation (DPO), or decoupled plasma nitridation (DPN) station connected to the central transfer station; an atomic layer deposition (ALD) station connected to the central transfer station; an optional pre-clean station connected to the central transfer station; and at least one controller connected to the one or more of the central transfer station, the RTP station, the DPO station, the DPN station, the ALD station or the optional pre-clean station. In one or more embodiments, the at least one controller has at least one configuration selected from: a configuration to move the wafer between stations using the robot; a configuration to perform a rapid thermal process; a configuration to perform a decoupled plasma process; a configuration to control a flow of an oxidizing gas into the RTP station or DPO station; a configuration to control a flow of a nitriding gas into the RTP station or DPN station; a configuration to deposit a silicon oxide film by atomic layer deposition; and a configuration to pre-clean the wafer.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

The disclosure is now described with reference to the following examples. Before describing several exemplary embodiments of the disclosure, it is to be understood that the disclosure is not limited to the details of construction or process steps set forth in the following description. The disclosure is capable of other embodiments and of being practiced or being carried out in various ways.

EXAMPLES

Comparative Example 1

A dipole last process was performed. The dipole last process included forming an interfacial layer comprising silicon oxide (SiOx) and having a thickness of 8 Å on a silicon (Si) substrate, forming a high-κ dielectric layer comprising hafnium oxide (HfOx) and having a thickness of 20 Å on the interfacial layer. Next, a lanthanum-containing precursor and a nitrogen-containing reactant was flowed over the surface of the high-κ dielectric layer to deposit a lanthanum nitride (LaN) dipole layer having a thickness of 10 Å on the high-κ dielectric layer. A capping layer comprising amorphous silicon (a-Si) and having a thickness of 10 Å was deposited on the dipole layer. Next, the substrate was annealed at a temperature of 1050° C. to drive in metal atoms from the dipole layer. Then, the capping layer and the dipole layer were removed from the substrate. The electronic device formed exhibited low V, requiring multiple annealing steps to reach an increased $V_t$ and $V_t$ tunability of less than 200 mV.

Comparative Example 2

A dipole first process was performed. The dipole first process included forming an interfacial layer comprising silicon oxide (SiOx) and having a thickness of 8 Å on a silicon (Si) substrate. Next, a lanthanum-containing precursor and a nitrogen-containing reactant was flowed over the surface of the interfacial layer layer to deposit a lanthanum nitride (LaN) dipole layer having a thickness in a range of from 1 Å to 5 Å on the interfacial layer. A high-κ dielectric layer comprising hafnium oxide (HfOx) and having a thickness of 20 Å was deposited on the dipole layer, and the substrate was annealed at a temperature of 700° C. using a rapid thermal process (RTP) in a nitrogen ($N_2$) ambient environment for 15 seconds. The electronic device formed exhibited $V_t$ tunability of greater than 200 mV, poor etch selectivity as dipole materials could not be selectively removed without removing a portion of the silicon oxide (SiOx) interfacial layer, and high leakage.

Comparative Example 3

A multi-$V_t$ dipole last process was performed. The multi-$V_t$ dipole last process included forming an interfacial layer comprising silicon oxide (SiOx) and having a thickness of 8 Å on a silicon (Si) substrate, forming a high-κ dielectric layer comprising hafnium oxide (HfOx) and having a thickness of 20 Å on the interfacial layer. The high-κ dielectric layer was densified at a temperature of 700° C. using a rapid thermal process (RTP) in a nitrogen ($N_2$) ambient environment for 15 seconds. Next, a lanthanum-containing precursor and a nitrogen-containing reactant was flowed over the surface of the densified high-κ dielectric layer to deposit a lanthanum nitride (LaN) dipole layer having a thickness of 10 Å on the densified high-κ dielectric layer. A capping layer comprising amorphous silicon (a-Si) and having a thickness of 10 Å was deposited on the dipole layer. The capping layer and the dipole layer were removed from one of the NFET or the PFET side of the substrate to expose the surface of the densified high-κ dielectric layer. Dipole layers of different thicknesses were deposited on the high-κ dielectric layer on each of the NFET and the PFET sides of the substrate, and capping layers were deposited on each of the dipole layers. Next, the substrate was annealed again at a temperature of 1050° C. to drive in metal atoms from the dipole layer. Then, the capping layer and the dipole layer were removed from the substrate, and work-function layers were deposited on the high-κ dielectric layer. The electronic device formed exhibited low V, requiring multiple annealing steps to reach an increased $V_t$ and $V_t$ tunability of less than 200 mV.

Inventive Example 1

A process following the operations of method 100 was performed. The process included forming a P-dipole stack and an N-dipole stack on a semiconductor substrate. Each of the P-dipole stack and the N-dipole stack were formed on a top surface of a channel located between a source and a drain on the semiconductor substrate. Each of the P-dipole stack and the N-dipole stack were formed by: depositing an interfacial layer (a silicon oxide (SiOx) layer on the top surface of the channel; depositing a hafnium oxide (HfOx) layer having a thickness of less than or equal to 5 Å on the interfacial layer; and depositing a lanthanum nitride (LaN) dipole layer on the hafnium oxide (HfOx) layer. The hafnium oxide (HfOx) layer having a thickness of less than or equal to 5 Å is continuous. Next, the deposited dipole layer was selectively etched from one of the P-dipole stack or the N-dipole stack and a thickness of the dipole layer on the other of the P-dipole stack or the N-dipole stack was increased and an electronic device with multiple threshold voltages (multi-$V_t$) was formed. The process included depositing a high-κ dielectric layer (hafnium oxide (HfOx)) having a thickness in a range of from 10 Å to 20 Å on the lanthanum nitride (LaN) dipole layer. The P-dipole stack and the N-dipole stack were annealed at a temperature of less than or equal to 1000° C. to drive in metal atoms from the dipole layer and densify the high-κ dielectric layer to form an annealed high-κ dielectric layer. Lastly, a work-function layer was deposited on the annealed high-κ dielectric layer. The electronic device formed exhibited improved threshold voltage ($V_t$) compared to a method that does not include forming a hafnium-containing layer having a thickness of less than or equal to 5 Å on the interfacial layer (Comparative Examples 1-3). Additionally, the process of Inventive Example 1, even after one cycle, resulted in an increase of 300 mV in flatband voltage ($V_{fb}$) compared to the Comparative Examples 1-3. The electronic device formed also exhibited reduced leakage ($J_g$) compared to a method that does not include forming a hafnium-containing layer having a thickness of less than or equal to 5 Å on the interfacial layer (Comparative Examples 1-3).

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of manufacturing an electronic device, the method comprising:

forming a P-dipole stack and an N-dipole stack on a semiconductor substrate, each of the P-dipole stack and the N-dipole stack formed on a top surface of a channel located between a source and a drain on the semiconductor substrate, forming each of the P-dipole stack and the N-dipole stack comprising sequentially:

depositing an interfacial layer on the top surface of the channel;

depositing a hafnium-containing layer on the interfacial layer, the hafnium-containing layer having a thickness of less than or equal to 5 Å;

depositing a dipole layer on the hafnium-containing layer;

selectively etching the dipole layer from one of the P-dipole stack or the N-dipole stack and increasing a thickness of the dipole layer on the other of the P-dipole stack or the N-dipole stack to form multiple threshold voltages (multi-$V_t$); and depositing a high-κ dielectric layer having a thickness in a range of from 10 Å to 20 Å on the dipole layer.

2. The method of claim 1, wherein the interfacial layer comprises a silicon oxide (SiOx) layer formed on doped silicon or undoped silicon.

3. The method of claim 1, wherein the hafnium-containing layer comprises one or more of hafnium oxide (HfOx), hafnium zirconium oxide (HfZrOx), nitrogen-doped hafnium oxide (HfOx), or nitrogen-doped hafnium zirconium oxide (HfZrOx).

4. The method of claim 1, wherein the hafnium-containing layer has a thickness of less than or equal to 3 Å.

5. The method of claim 1, wherein the high-κ dielectric layer comprises one or more of hafnium oxide (HfOx), hafnium zirconium oxide (HfZrOx), zirconium oxide (ZrOx), nitrogen-doped hafnium oxide (HfOx), nitrogen-doped hafnium zirconium oxide (HfZrOx), and nitrogen-doped zirconium oxide (ZrOx).

6. The method of claim 1, wherein depositing the dipole layer comprises exposing the semiconductor substrate to a pulse of a metal-containing precursor and a pulse of a reactant by an atomic layer deposition (ALD) process or a chemical vapor deposition (CVD) process.

7. The method of claim 6, wherein the metal-containing comprises one or more of titanium (Ti), tantalum (Ta), aluminum (Al), niobium (Nb), antimony (Sb), tellurium (Te), germanium (Ge), gallium (Ga), lanthanum (La), yttrium (Y), strontium (Sr), scandium (Sc), or boron (B).

8. The method of claim 6, wherein the reactant comprises ammonia (NH₃).

9. The method of claim 6, wherein the dipole layer comprises lanthanum nitride (LaN) or aluminum nitride (AlN).

10. The method of claim 1, further comprising annealing the P-dipole stack and the N-dipole stack at a temperature of less than or equal to 1000° C. to drive in metal atoms from the dipole layer and densify the high-κ dielectric layer to form an annealed high-κ dielectric layer.

11. The method of claim 10, further comprising depositing a work-function layer on the annealed high-κ dielectric layer.

12. The method of claim 1, wherein the method improves a threshold voltage ($V_t$) of the electronic device compared to a method that does not include forming a hafnium-containing layer having a thickness of less than or equal to 5 Å on the interfacial layer.

13. The method of claim 1, wherein the method reduces leakage ($J_g$) of the electronic device compared to a method that does not include forming a hafnium-containing layer having a thickness of less than or equal to 5 Å on the interfacial layer.

14. A method of manufacturing an electronic device, the method comprising:

forming a P-dipole stack and an N-dipole stack on a semiconductor substrate, each of the P-dipole stack and the N-dipole stack formed on a top surface of a channel located between a source and a drain on the semiconductor substrate, forming each of the P-dipole stack and the N-dipole stack comprising sequentially:

depositing an interfacial layer on the top surface of the channel, the interfacial layer comprising silicon oxide (SiOx);

depositing a hafnium-containing layer on the interfacial layer, the hafnium-containing layer comprising hafnium oxide (HfOx) and having a thickness of less than or equal to 5 Å;

depositing a dipole layer comprising lanthanum nitride (LaN) on the hafnium-containing layer;

selectively etching the dipole layer from one of the P-dipole stack or the N-dipole stack and increasing a thickness of the dipole layer on the other of the P-dipole stack or the N-dipole stack to form multiple threshold voltages (multi-$V_t$); and depositing a high-κ dielectric layer having a thickness in a range of from 10 Å to 20 Å on the dipole layer.

15. The method of claim 14, wherein the high-κ dielectric layer comprises one or more of hafnium oxide (HfOx), hafnium zirconium oxide (HfZrOx), zirconium oxide (ZrOx), nitrogen-doped hafnium oxide (HfOx), nitrogen-doped hafnium zirconium oxide (HfZrOx), and nitrogen-doped zirconium oxide (ZrOx).

16. The method of claim 14, further comprising annealing the P-dipole stack and the N-dipole stack at a temperature of less than or equal to 1000° C. to drive in metal atoms from the dipole layer and densify the high-κ dielectric layer to form an annealed high-κ dielectric layer.

17. The method of claim 16, further comprising depositing a work-function layer on the annealed high-κ dielectric layer.

18. The method of claim 14, wherein the method reduces leakage ($J_g$) of the electronic device compared to a method that does not include forming a hafnium-containing layer having a thickness of less than or equal to 5 Å on the interfacial layer.

* * * * *